(12) United States Patent
Sadleir

(10) Patent No.: US 9,913,414 B2
(45) Date of Patent: Mar. 6, 2018

(54) METHOD AND APPARATUS OF IMPLEMENTING A MAGNETIC SHIELD FLUX SWEEPER

(71) Applicant: The United States of America as represented by the Administrator of the National Aeronautics and Space Administration, Washington, DC (US)

(72) Inventor: John E. Sadleir, Washington, DC (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 14/846,498

(22) Filed: Sep. 4, 2015

(65) Prior Publication Data
US 2017/0071082 A1    Mar. 9, 2017

(51) Int. Cl.
| | | |
|---|---|---|
| *H05K 9/00* | (2006.01) | |
| *G01R 33/00* | (2006.01) | |
| *G01R 33/025* | (2006.01) | |

(52) U.S. Cl.
CPC ....... *H05K 9/0077* (2013.01); *G01R 33/0076* (2013.01); *G01R 33/025* (2013.01)

(58) Field of Classification Search
CPC .. H05K 9/0077; H05K 9/0071; H05K 9/0083; H01F 1/1535; H01F 1/15375; Y10T 428/12167
See application file for complete search history.

(56) References Cited

U.S. PATENT DOCUMENTS

| | | | | |
|---|---|---|---|---|
| 4,923,533 A | * | 5/1990 | Shigeta | ........... H01F 1/1535 148/304 |
| 5,260,128 A | * | 11/1993 | Ishii | ........... B32B 15/08 174/394 |
| 8,330,055 B2 | * | 12/2012 | Ueda | ........... H05K 9/0086 148/100 |

* cited by examiner

*Primary Examiner* — Bernard Rojas
(74) *Attorney, Agent, or Firm* — Heather Goo; Bryan A. Geurts; Mark P. Dvorscak

(57) ABSTRACT

The present invention relates to a method and apparatus of protecting magnetically sensitive devices with a shield, including: a non-superconducting metal or lower transition temperature ($T_c$) material compared to a higher transition temperature material, disposed in a magnetic field; means for creating a spatially varying order parameter's $|\Psi(r,T)|^2$ in a non-superconducting metal or a lower transition temperature material; wherein a spatially varying order parameter is created by a proximity effect, such that the non-superconducting metal or the lower transition temperature material becomes superconductive as a temperature is lowered, creating a flux-free Meissner state at a center thereof, in order to sweep magnetic flux lines to the periphery.

26 Claims, 7 Drawing Sheets

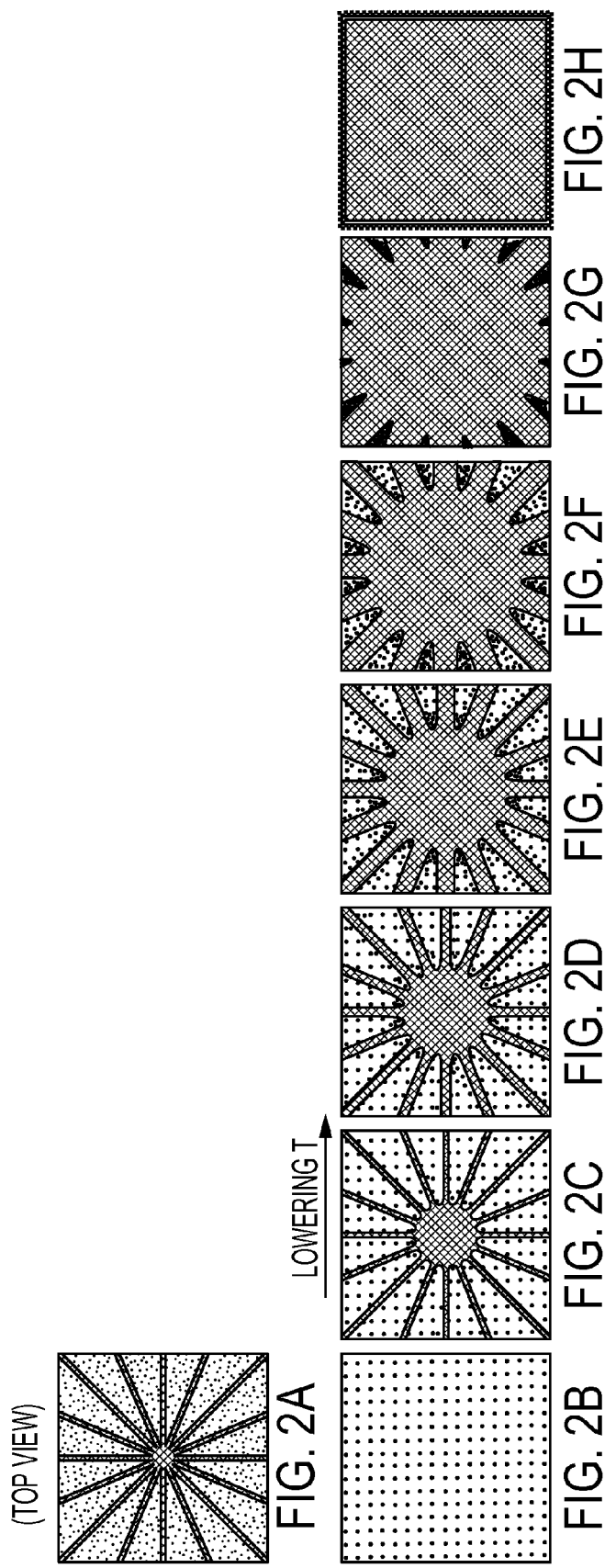

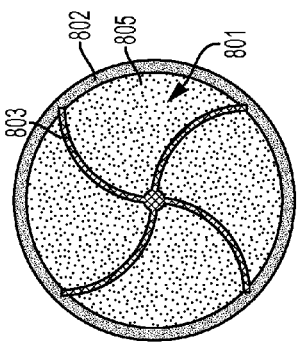
FIG. 8A
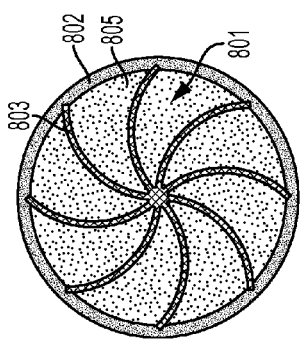
FIG. 8B
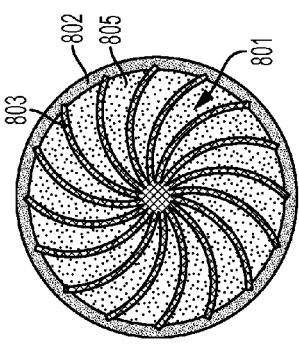
FIG. 8C
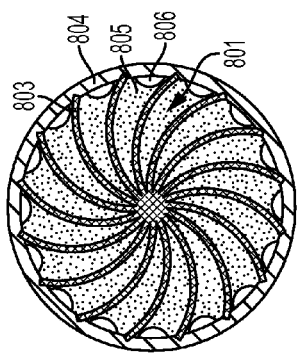
FIG. 8D
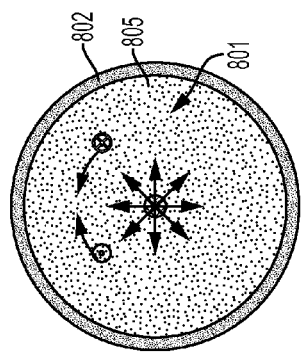
FIG. 8E
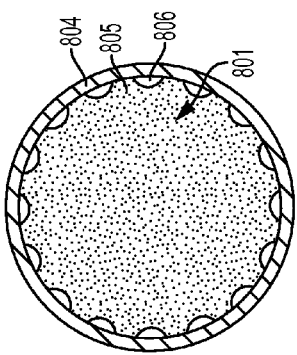
FIG. 8F
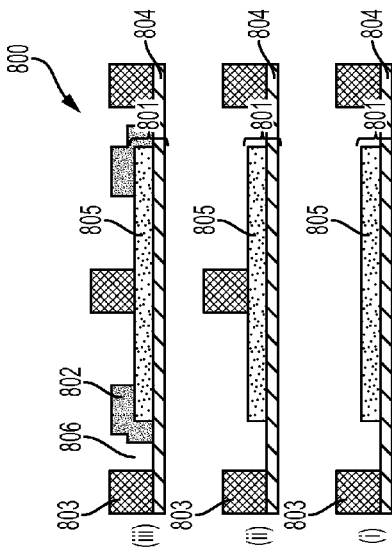
FIG. 8G

METHOD AND APPARATUS OF IMPLEMENTING A MAGNETIC SHIELD FLUX SWEEPER

BACKGROUND OF THE INVENTION

1. Field of the Invention

The present invention relates to a magnetic shield that operates by sweeping magnetic flux lines to the periphery of the shield when cooled to a base operating temperature. Users can add the flux-sweeping magnetic-shield structure to magnetically sensitive regions of a wide range of electronic sensing applications, such as in lithographic circuit designs, in order to protect those regions from magnetic contamination or "crosstalk".

2. Description of the Related Art

The need for improved sensing capabilities motivates low temperature detectors technologies. Operating devices at low temperatures fundamentally reduces the detectors thermal noise environment making systems capable of sensing smaller energy signals. In addition to a reduced thermal noise, lower temperatures allows superconductivity to be used in sensing applications. Superconductors offer a plethora of remarkable physical properties such as zero direct current (DC) resistance, large diamagnetic response, and despite infinite DC conductivity both low thermal conductivity and heat capacity. Further, the macroscopic quantum mechanical nature of superconductors allows for interferometry of the quantum wave function describing the superconducting condensate. Superconductors are the sensor of choice for a wide range of device applications, and their usage will continue to grow for the foreseeable future as demands continue to push the limits of technology.

Some superconducting devices include: Superconducting Quantum Interference Device (SQUIDs), Superconducting Transition Edge-Sensor (TES), Superconducting Kinetic Induction Detectors (KID), superconducting nanowire single photon detectors, Magnetic Penetration Depth Thermometers (MPTs), Josephson Junction Arrays, superconducting quantum limited parametric amplifiers, superconducting mixers, Scanning Josephson Junction (SJJ) and scanning SQUID microscopes, and superconducting quantum bits (Qubits) for quantum computing applications.

However, all the above superconductive devices could benefit from improved magnetic field control. Many of the detectors are sensitive to a very small fraction of the earth's magnetic field, making improved control essential for many applications. In many cases, along with unmatched sensitivity, superconducting devices afford sensitivity to unwanted and difficult to control physical properties (for instance magnetic field). Accordingly, control of the magnetic environment is imperative to advance many state-of-the-art superconducting systems.

Conventionally, superconducting magnetic shielding structures have been used to control magnetic field environments at low temperatures. One prior art technique includes cooling multiple concentric flexible superconducting bladders to the superconducting state. Next the bladders are expanded starting with the outermost, each expansion pulling the trapped flux lines further away creating a very low magnetic field environment in the center. Various other techniques have been attempted to improve magnetic flux expulsion in superconducting shields by creating and controlling thermal gradients in the superconductor when cooling through the transition temperature $T_c$. In principle, if the thermal gradient is sufficiently greater than the intrinsic spatial variation of the superconducting transition temperature $T_c$ of the magnetic shield then the flux can be swept out. However, maintaining such thermal gradients can be challenging to implement because the thermal conductivity and heat capacity in the superconducting state can differ significantly from the normal state region, and sometimes, thermal anchoring to control the magnetic shield is limited or simply not possible. Further, the currents from biased heaters to control temperature themselves can produce unwanted sources of magnetic fields. In addition, the thermal gradients drive electrical currents which can cause flux lines to become trapped in the superconductor.

Thus, a magnetic shield implementation that can locally reduce the ambient magnetic field and sweep magnetic flux lines from sensitive components in lithographic circuit applications, for example, is needed.

SUMMARY OF THE INVENTION

The present invention relates to a magnetic shield that operates by sweeping field lines to the periphery of the shield when cooled to a base operating temperature. The shield is composed of a heterostructure of different superconductors (and potentially normal metal) structures to produce a spatially varying order parameter by the proximity effect. Once a perfect Meissner state is reached throughout the shield and the shield is cooled well below the lowest transition temperature the ambient magnetic field will be reduced in a volume nearby the shield; in addition subsequent changes of magnetic field will be suppressed by the shield. Users can add these flux-sweeping magnetic-shielding structures separated by a thin insulating to magnetically sensitive regions of a wide range of electronic sensing applications, such as in lithographic circuit designs, in order to protect those regions from magnetic contamination or "crosstalk".

The present invention produces a flux-free Meissner state in a superconductor, which conventionally, has been very difficult to achieve. In order to reach a flux-free Meissner state, the magnetic shield is cooled well below its superconducting transition temperature $T_c$, where the shield is driven deep into the superconducting phase, and where the critical magnetic field is increased. Then, magnetic fields much larger than the ambient magnetic field during the cool-down can be applied, and the superconducting magnetic shield will remain in the flux-free Meissner state. Accordingly, the superconducting magnetic shield will reduce the magnetic field in a neighboring region or enclosing volume, and acts as an excellent magnetic shield for the enclosing and neighboring volume to direct current (DC) and time-varying magnetic fields, provided the magnetic field density at the edge of the shield does not exceed the critical field. Thus, the magnetic shield is used to reduce and/or control the magnetic field environment over some volume of space, and any sensor occupying this volume will be shielded.

The challenge of a superconducting shield is obtaining a perfect flux-free Meissner state. When a superconductor is cooled through the transition temperature, the critical magnetic field is zero, and it is challenging to not trap a magnetic field. This is because once the magnetic field is nucleated inside the superconducting shield, an energy barrier to a vortex exit develops upon further cooling, making it increasingly difficult to remove the flux, and the magnetic flux becomes trapped in the superconductor. Once the magnetic field lines are enclosed in a region of superconducting phase further cooling increases the energy barriers to flux exiting and the flux becomes trapped or frozen inside the element.

The present invention allows for the superconductivity to nucleate in a small interior region and then upon further cooling the superconducting region continues to grow as a single simply connected volume. As the shield is cooled the superconducting region is at all times in the flux-free Meissner state. Thus, the present invention allows for the magnetic field to be swept out by having a growing superconducting region achieved by the proximity effect. In all cases, the shield is designed to have a spatially varying transition temperature, where the variation allows a single superconducting region of superconductivity to sweep all the magnetic field to the periphery, such that no flux remains trapped inside.

In one embodiment, the magnetic field flux sweeper of the present invention is placed in close proximity to the field sensitive device, such as a sensor, to: (1) reduce the ambient magnetic field environment for the device; (2) protect/shield the device from further changes in the ambient magnetic field; and (3) reduce the magnitude of the magnetic field generated by the device itself and thus, reduce its impact on other neighboring sensors or components. In addition this invention can be used to make the superconductive device itself or superconducting components of the device, flux-free in a Meissner state, or in a reduced flux state.

The present invention is compatible with other shielding techniques, and can be used in concert with other techniques to produce very low magnetic fields near the device(s). These may include combinations of: (1) magnetic field sense and applied magnetic field compensation current carrying coils to cancel vector components of the magnetic field; (2) high magnetic permeability materials with optional degaussing coils to remove magnetic field lines from sensitive regions; (3) superconducting elements that use a diamagnetic response; and/or (4) superconducting loops and/or cylindrical structures that will automatically produce a current and magnetic field in opposition to changes in magnetic field consistent with Faraday's Law, Lenz's law, and the Aharonov-Bohm effect.

In one embodiment, a higher $T_c$ material superconducting loop can be used to surround an array of detectors. It is also possible to have higher Tc material superconducting loops around individual sensors making up an array. These continuous superconducting loops can also be multi-purposed to carry current to the devices while also providing shielding to the device from changes in the magnetic field. Above the base temperature, any change in magnetic field will generate a current in the loop oriented to oppose the applied magnetic field, thus reducing the field density of elements internal to the loop.

In one embodiment, a shield which protects magnetically sensitive devices, includes: a non-superconducting metal or lower transition temperature ($T_c$) material compared to a higher transition temperature material, disposed in a magnetic field; means for creating a spatially varying order parameter's $|\Psi(x)|^2$ in a non-superconducting metal or a lower transition temperature material; wherein the spatially varying order parameter is created by a proximity effect, such that the non-superconducting metal or the lower transition temperature material becomes superconductive as a temperature is lowered, creating a flux-free Meissner state, in order to sweep magnetic flux lines to a periphery of the non-superconducting metal or the lower transition temperature material.

In one embodiment, the proximity effect is one of a variable thickness proximity effect, a longitudinal proximity effect, an inverse proximity effect, or combination thereof.

In one embodiment, the shield further includes a higher transition temperature ($T_c$) superconducting material disposed on the non-superconducting metal or the lower transition temperature ($T_c$) material.

In one embodiment, the higher transition temperature superconducting material is disposed in a plurality of different patterns on the non-superconducting metal or the lower transition temperature ($T_c$) material.

In one embodiment, the shield is provided in a plurality of hetero structure two-dimensional and three-dimensional structures, including planar and non-planar structures.

In one embodiment, the shield includes a planar disc or a cylinder.

In one embodiment, the shield further includes a highest transition temperature ($T_c$) superconducting material; the non-superconducting metal or the lower transition temperature material and the higher transition temperature material form a bilayer; and the highest transition temperature superconducting material is disposed on the bilayer.

In one embodiment, the proximity effect is a combination of the longitudinal proximity effect and the variable thickness proximity effect.

In one embodiment, the shield is a cylinder; and the higher transition temperature material is provided in a strip with a width less than a critical length.

In one embodiment, the cylinder is open-ended, and the planar disc is provided at one end of the open-ended cylinder.

In one embodiment, the shield further includes: an intermediate transition temperature superconducting material, the intermediate transition temperature superconducting material having a transition temperature between the higher transition temperature superconducting material and the non-superconducting metal; and the planar disc includes the higher transition temperature superconducting material disposed in the plurality of different patterns on one of the intermediate transition temperature superconducting material, or a bilayer of the non-superconducting metal and a superconducting material.

In one embodiment, the sides of the open-ended cylinder include the intermediate transition temperature superconducting material, and the non-superconducting metal or the lower transition temperature ($T_c$) material in a variable thickness; and the magnetic flux lines are swept outwards from the center of the planar disc to a perimeter of the planar disc, and from a top of the open-ended cylinder where the planar disc is disposed, to a bottom of the open-ended cylinder.

In one embodiment, the planar disc includes the higher transition temperature superconducting material disposed in plurality of different patterns on a bilayer of the non-superconducting metal and a superconducting material; and a superconducting lead is connected to one of the non-superconducting metal or the higher transition temperature superconducting material at each of two ends thereof.

In one embodiment, the shield further includes: a metal bank structure deposited on at least the non-superconducting metal; where the metal bank structure includes gold.

In one embodiment, the non-superconducting metal is gold and the higher transition temperature superconducting material is molybdenum; and the superconducting lead includes niobium.

In one embodiment, the plurality of different patterns includes another superconducting lead disposed at a center of the planar disc at a greater thickness than at edges thereof, and allows for tuning of the shield; or wherein the superconducting lead is disposed at edges of the metal bank structure and separately at the center of the planar disc.

In one embodiment, trapping regions are disposed at edges of the at least one of the non-superconducting metal or the higher transition temperature superconducting material.

In one embodiment, the shield further includes: an insulator layer on which the higher transition temperature material is disposed; and a metal layer ground plane on which the insulator layer is disposed; and a superconductor disposed at edges of the metal layer ground plane.

In one embodiment, an array of sensors includes a plurality of shields.

In one embodiment, the array further includes: a magnetometer disposed in the array; a continuous superconducting loop around the array; and a compensating magnetic field coil disposed around the array.

In one embodiment, a method of protecting a magnetically sensitive device, includes: creating a spatially varying order parameter's $|\Psi(x)|^2$ in a non-superconducting metal or a lower transition temperature ($T_c$) material compared to a higher transition temperature material, the non-superconducting metal or the lower transition temperature material being disposed in a magnetic field; wherein the spatially varying order parameter is created by a proximity effect, such that the non-superconducting metal or the lower transition temperature material becomes superconductive as a temperature is lowered, creating a flux-free Meissner state, in order to sweep magnetic flux lines to a periphery of the non-superconducting metal or the lower transition temperature material.

In one embodiment, a sensing element of a cryogenic detector includes: a magnetic flux sweeper which uses a proximity effect to create spatially varying order parameter's $|\Psi(r,T)|^2$ such that upon cooling, the sensing element becomes superconductive and magnetic flux lines are swept to a periphery creating a flux-free Meissner state in said sensing element of the cryogenic detector.

In one embodiment, the magnetic flux sweeper is a temperature dependent resistor of a superconducting transition-edge sensor.

In one embodiment, the magnetic flux sweeper is a temperature dependent magnetic response of a magnetic penetration depth thermometer (MPT).

In one embodiment, the magnetic flux sweeper is a superconducting quantum interference device (SQUID), rf-SQUID, SQUID array, superconducting parametric amplifier, superconducting nanowire detector, superconducting kinetic inductance detector (KID), superconducting mixer, or superconducting q-bit.

Thus has been outlined, some features consistent with the present invention in order that the detailed description thereof that follows may be better understood, and in order that the present contribution to the art may be better appreciated. There are, of course, additional features consistent with the present invention that will be described below and which will form the subject matter of the claims appended hereto.

In this respect, before explaining at least one embodiment consistent with the present invention in detail, it is to be understood that the invention is not limited in its application to the details of construction and to the arrangements of the components set forth in the following description or illustrated in the drawings. Methods and apparatuses consistent with the present invention are capable of other embodiments and of being practiced and carried out in various ways. Also, it is to be understood that the phraseology and terminology employed herein, as well as the abstract included below, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the methods and apparatuses consistent with the present invention.

BRIEF DESCRIPTION OF THE DRAWINGS

FIGS. 2(A)-(H) show top views of a planar magnetic flux sweeper shield, cooled to its base temperature in a uniform magnetic field oriented normal to the plane of the shield, according to one embodiment consistent with the present invention.

FIGS. 8(A)-8(B) show side views of a magnetic shield, such as a sensor, according to one embodiment consistent with the present invention.

FIG. 8C shows an enlarged view of one end of the shield of FIG. 8A or FIG. 8B, according to one embodiment consistent with the present invention.

FIG. 8D shows the magnetic flux lines of the shield of FIG. 8B, according to one embodiment consistent with the present invention.

FIG. 8E is a top view of the shield of FIG. 8A or 8B, with an array of shields according to one embodiment consistent with the present invention.

FIG. 8F is an enlarged view of one of the shields of FIG. 8E, according to one embodiment consistent with the present invention.

FIG. 8G shows trapping regions in the magnetic shield, according to one embodiment consistent with the present invention.

DESCRIPTION OF THE INVENTION

Figure 1A:
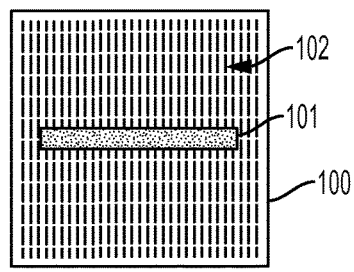
FIGS. 1(A)-(E) show side views of a planar magnetic flux sweeper shield, cooled to its base temperature in a uniform magnetic field oriented normal to the plane of the shield, according to one embodiment consistent with the present invention.

The present invention relates to a magnetic shield that operates by sweeping field lines to the periphery of the shield when cooled to a base operating temperature.

The superconducting phase is a thermodynamic state that exists in a volume of phase space below a critical temperature $T_c$, below a critical magnetic field $B_c$, and below a critical current density $J_c$. Two hallmarks of the superconducting state are: 1) zero direct current (DC) resistivity; and 2) a perfect diamagnetic response called the "Meissner effect".

For both type-I and type-II superconductors, if no magnetic field lines penetrate the interior superconducting volume, it is said to be in the "Meissner state". In the Meissner state, magnetic field lines can only enter the bounding surface of the volume up to a characteristic length called the "penetration depth" that also characterizes the length over which the Meissner screening currents are localized.

A superconducting metal cooled in a non-zero magnetic field will have spontaneous Meissner screening currents appear on the surface upon entering the superconducting state. The Meissner screening currents are oriented such that the total field inside the superconductor is zero. This response is called "perfect diamagnetism" when the field inside the superconductor is completely canceled.

When the magnetic field at the surface of a superconductor exceeds the critical field, it becomes energetically favorable for magnetic flux lines to enter the superconductor. The superconductor interior will then contain a mixture of flux-free superconducting regions and also normal metal regions containing flux lines in some integral number of magnetic flux quantum.

A superconducting film, block or plate will tend to trap the magnetic field in bundles, which can take different forms. For a type-I superconductor, when the magnetic field at the surface exceeds the critical field $B_c$, the Meissner state is broken, but in this case magnetic field lines enter in the form of bundles of dendritic domains of magnetic flux forming larger magnetic lamella structures (composed of many $\Phi_0$ (Phi0)), each of which contains an integral number of magnetic flux quanta (note: this is called the "intermediate state"—intermediate between fully superconducting and fully normal metal containing regions or both). As the field is increased further, the lamella grow until the normal state consumes the entire volume.

For a type-II superconductor, when the magnetic field at the surface exceeds the critical field $B_{c1}$, magnetic flux enters in the form of magnetic vortices (i.e., smaller, isolated tubes of magnetic flux, each containing one flux quantum $\Phi_0$), breaking the perfect Meissner state and the superconductor enters the "mixed state" (i.e., a mixture of superconducting and normal metal regions).

As noted above, a superconductor in the Meissner state with an applied field $B_a$ will set up Meissner screening currents at the surface of the superconductor such that the total field interior to the superconductor is zero. A superconductor placed inside a uniform magnetic field can have the resultant magnitude at its surface, many orders of magnitude larger than the initial uniform field. The size of the enhancement is dependent upon the "demagnetization factor" (i.e., a geometry-dependent term that accounts for the concentration of magnetic field lines at the surface of the sample), and the direction of the uniformly applied magnetic field relative to the sample. (Note: demagnetization fields of arbitrary shape are very hard to calculate. The problem is greatly simplified when the magnetic material is ellipsoidal, in which case the demagnetization effects can be describe by a single demagnetization factor. Nevertheless it is common practice to approximate nonellipsoidal structures with an ellipsoidal dimensions and use the associated demagnetization factor to estimate the effects of demagnetization and resulting magnetic fields for different geometries).

Thus, once these magnetic field lines enter a superconductor, hysteresis and geometric effects can make it very challenging to return to a flux-free Meissner state. Even in perfect single crystal samples, there exists geometric, topological, or energy barriers, to magnetic flux entry and exit from the superconductor, from a number of different sources. In both type-I and type-II superconductors, sources of irreversibility include physical and chemical defects, impurities, mechanical stress, dislocations, geometric, surface and edge barriers, of the superconducting material. Further, cooling a superconducting shield through its transition temperature in a non-zero magnetic field, using known cooling mechanisms, will frequently have imperfect flux expulsion.

Thus, the problem of using superconducting shields reduces to simply obtaining a true Meissner state in a superconductor. An imperfect Meissner state has significantly negative consequences. Even a small fraction of a single fluxon trapped in the vicinity of many cryogenic sensors, for example, can significantly change the response in a sensor or detector. Additionally, vortex trapping will vary across an array of sensors, for example, and the trapping behavior can be irreproducible on cool down to the next. Any non-uniformity in magnetic field over an array of sensors means that otherwise identical pixels in a sensor array will be in different operating states. Variation from one cool down to the next means that the difference in operating states over an array cannot easily be corrected for. Further, spatial variation over an array or over an individual sensor of the magnetic field means it can not be easily canceled by an applied compensating magnetic field.

The magnetic flux may be uniform at a higher temperature, and with a lowered temperature, the magnetic flux changes around field-sensitive regions, with some lines of magnetic flux being trapped in these regions. Accordingly, the present invention provides a magnetic shield or magnetic flux sweeper that is able to produce a true flux-free Meissner state. Once the Meissner state in the magnetic shield is obtained, sizable fields can be applied and completely screened with the superconductor so long as the critical magnetic field at the edge of the superconductor is not exceeded.

To achieve the present invention, the "proximity effect" is used. The "proximity effect" refers to when a superconductor is connected to a non-superconducting metal, and the superconducting order diffuses out of the superconductor, causing superconductivity into the normal metal. The converse situation, or "inverse proximity effect", occurs whereby the diffused superconducting order moving into the normal metal, results in a reduction of the strength of the superconducting order parameter in the superconductor.

The present invention uses the above-described superconducting "proximity effect" and/or the "inverse proximity effect" to form a spatially varying order parameter's $|\Psi(r,T)|^2$. The spatially varying order parameter's $|\Psi(r,T)|^2$ of the present invention evolves as the temperature is lowered, and sweeps or brushes the magnetic flux lines away, creating a flux-free environment in field sensitive regions.

Specifically, when designed to expel magnetic flux from a region of space, the proximity effect(s) is/are used in concert to make a superconducting order parameter's $|\Psi(r,T)|^2$ strongly superconducting in the center of a normal metal/superconductor geometric heterostructure, and more weakly superconducting toward the perimeter.

In one embodiment, FIG. 1(A) shows a planar flux sweeping magnetic shield 100 of a fully normal metal 101 with a uniform magnetic field 102 oriented normal to the plane of the shield 100 (i.e., which is the hardest direction to shield, and the most important direction for lithographic superconducting circuits). It should be noted that the invention will also shield spatially non-uniform magnetic fields where the fields need not be spatially uniform in either magnetic or vector directions.

Figure 1B:
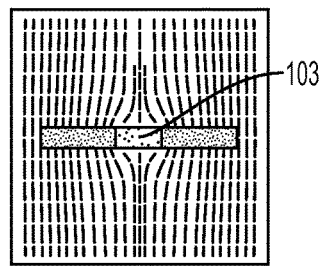
Figure 1C:
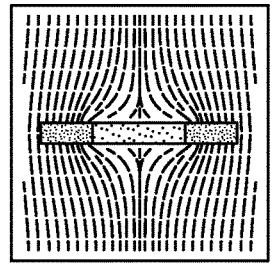
Figure 1D:
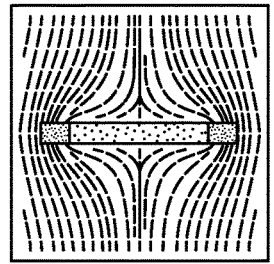
Figure 1E:
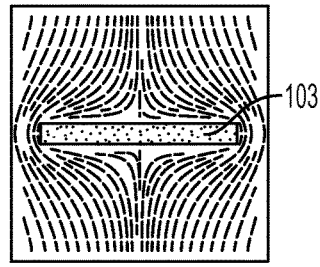

At this point, the temperature T is greater than the superconducting transition temperature of the shield $T_{c\_max}$. As the temperature T is lowered, and the magnetic shield flux sweeper 100 is passively cooled through the superconducting transition temperature $T_{c\_max}$ (i.e., the highest $T_{c\_max}$ region is in the center of the magnetic shielding structure 100), the superconductivity 103 first nucleates in the center of the shielding body 100 (see FIG. 1(B)), and as the magnetic shield 100 is cooled, this superconducting/normal phase boundary region of superconducting order grows. As it grows, the superconducting flux-free Meissner state grows (see FIGS. 1(C) and 1(D)), the flux density continues to increase at the normal metal edges, and the normal component of the magnetic field continues to decrease in regions above and below the shield 100. When the shield 100 reaches base temperature (see FIG. 1(E)), it is in a completely superconducting in a flux-free Meissner state, with large magnetic field reductions in regions above and below the shielding surface, where the magnetic flux lines 102 are swept outward. In other words, the superconducting/normal phase boundary region monotonically grows out from the center, carrying with it the magnetic flux lines 102 from that region, so that the magnetic field 102 is expelled from the small central region by the Meissner effect.

The depicted planar flux sweeping shield 100 can be fabricated lithographically and easily added to integrated circuit processes. The planar shield 100 produces reduced field environments above and below the shield 100 greatly reducing the component normal to the film plane which is most difficult to shield for sensor devices and also the dominate magnetic field component effecting many thin film superconducting devices. The present invention can also be used in nonplanar configurations that will be capable of screening magnetic field vector components in any direction.

FIG. 2(A) shows a similar scenario with another embodiment where a higher $T_c$ superconducting layer (grey) 200 is disposed on a lower $T_c$ weak pinning superconducting layer 201 (or in one embodiment, a superconducting/normal-metal bilayer 201). However, one of ordinary skill in the art would know that in another embodiment, a higher $T_c$ superconducting material could be disposed on a normal metal, to achieve the same results as discussed below.

In summary, as shown in FIG. 2(B), the normal metal has a uniform magnetic field (dots) normal to the plane, and with lowering temperature T as shown in FIG. 2(C), the growing grey regions show the superconducting Meissner state (which is free of magnetic field lines) (see FIG. 2(D)-2(G)), which spreads outward until the fully superconducting Meissner state with magnetic flux lines is concentrated at the edges (see FIG. 2H). The dots are the magnetic flux lines and their density is the magnitude of the magnetic field. Upon cooling, a central superconducting Meissner state (free of magnetic field lines) nucleates and grows outward when cooled to lower temperatures, remaining a single simply connected growing Meissner state region throughout. Once again, although the field depicted is uniform, the flux sweeper is also capable of shielding non-uniform magnetic fields (such as found in space applications).

The planar flux sweeping design of the present invention includes eight (8) higher $T_c$ superconductor strips on top of a larger square of lower $T_c$ or normal metal material. The higher $T_c$ strip's arrangement in FIGS. 2A-2H includes eight (8) lines separated by equal angles. It is important that the strip width of the higher $T_c$ material is of an order or less than the Clem critical width for the field present. (The Clem width is the critical superconducting strip width below which no flux is trapped, and it enters the perfect flux-free Meissner state. The result is independent of details such as the type or nature of pinning sites, and assumes that the coherence length x, the strip width W, the penetration depth $\lambda$, and film thickness d satisfies $x<<W<<\Lambda$, where $\Lambda$ is the Pearl length defined to be $\Lambda=2\lambda(T)^2/d$. The relationship between magnetic field $B_m$ and width was found to be $B_m$=pi Phi0/(2W)^2 (i.e., the "Clem width"—see J. R. Clem, Bull. Am. Phys. Soc. 43, 411 (1998)). A similar result was calculated by K. K. Likharev, see Soy. Radiophys. 14, 722 (1972), but with a slightly different prefactor; however, it means that if a superconducting strip is cooled in a magnetic field of size $B_m$, then the Meissner state is entered in the superconducting strip provided $W \leq W_{crit}$, where $W_{crit}$=pi Phi0/(4 $B_m$))^{0.5}. Measurements by Stan et al, PRL v92 p097003 (2004) showed $B_m$~Phi0/W^2, where Phi0=h/(2e).)

However, the present invention is not limited to the specific number or arrangement of strips depicted. In addition, the underlying lower $T_c$ or normal metal material is not limited in the shape or size. Rather, more importantly, it is the arrangement of different $T_c$ superconductors and normal metals which generate by the proximity effect, a single, simply connected Meissner state region that grows upon cooling.

Further, the present invention produces an environment with low magnetic fields which can be implemented in a variety of structures, to provide magnetic shielding therefor.

In one embodiment, magnetic shielding designs can be active or passive, to provide shielding and remove flux from the interior.

As noted above, the spatially varying $T_c$ is achieved by one or more of the following three methods:

(1) changing the relative thicknesses of heterostructure in one embodiment, such as a superconducting/normal metal bilayer (or trilayer or other multi-layer sandwich thickness variation), or superconducting/superconducting bilayer (or trilayer or other multi-layer sandwich thickness variation), where each superconductor can have its own different intrinsic $T_c$ value, to achieve a $T_c$ gradient in normal metal thickness and/or superconducting thickness. See FIGS. 3(A)-3(D) for exemplary embodiments of magnetic shield flux sweeping using the variable thickness proximity effect. In these exemplary embodiments, the higher $T_c$ superconducting material is shown in varying thicknesses, in comparison with the lower $T_c$ superconducting or normal metal material.

Figure 3A:
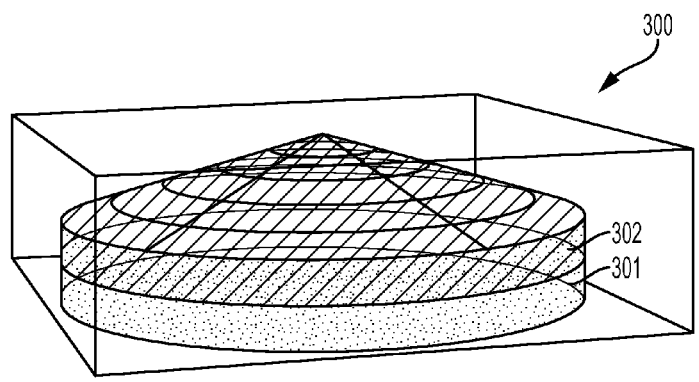
FIGS. 3(A)-3(D) show schematic views of various configurations of a flux sweeping shield using the variable thickness proximity effect, according to embodiments consistent with the present invention.

For example, in FIG. 3A, one embodiment of the variable thickness proximity effect in a planar disc shield 300 is shown. One of ordinary skill in the art would know that the lower $T_c$ superconducting or normal metal material 301 can be either disposed on top of the higher $T_c$ superconducting material 302, or below it (as shown), and either layer 300, 301 can vary in thickness.

Figures 3B, 3C, 3D:
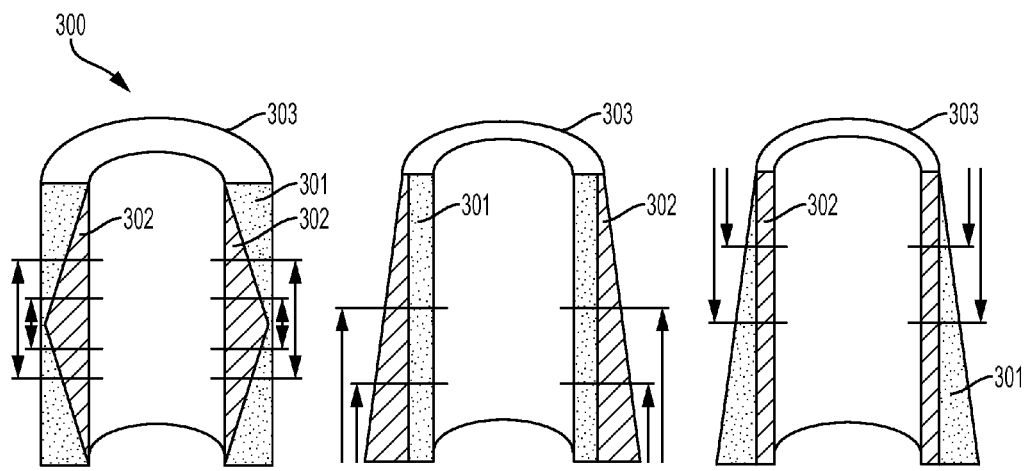

In the exemplary embodiments of FIGS. 3B-3D, the cross-sections of open-ended superconducting shields 303 are shown, with varying thickness layers (exaggerated in the drawings) of the lower $T_c$ superconducting or normal metal material 301, and the higher $T_c$ superconducting material 302. As noted above, when the temperature is lowered, the superconducting region grows out from the higher $T_c$ superconducting material 302 toward the lower $T_c$ superconducting or normal metal material 301, in the direction to the normal boundary as shown by the arrows, sweeping the flux lines.

(2) using the longitudinal proximity effect in one embodiment, where a higher $T_c$ superconducting structure (i.e., spatially separated multilayers with different $T_c$'s by virtue of the stack of the layers), enhances the superconducting order in its proximity.

Figure 4:
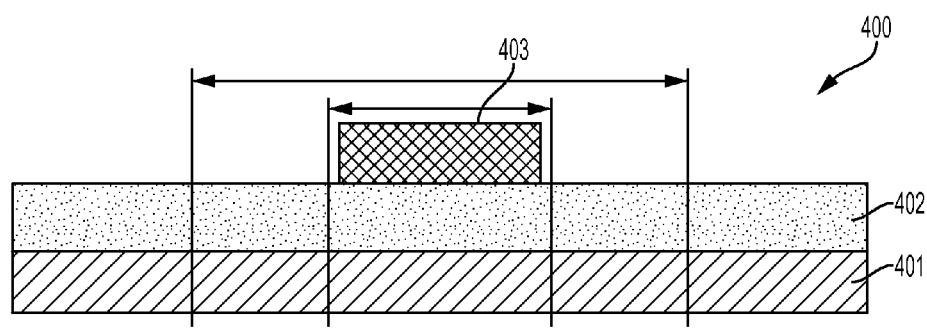
FIG. 4 is a schematic side view of a flux sweeping shield using the longitudinal proximity effect, according to one embodiment consistent with the present invention. Arrows depict how the simply connected Meissner state region (free of magnetic field lines) grows upon cooling.

In one exemplary embodiment, as shown in FIG. 4, a shield 400 comprised of a bilayer of lower $T_c$ superconducting or normal metal material 402 disposed on a higher $T_c$ superconducting material 401, further includes a superconductor 403 with highest $T_c$ disposed on the lower $T_c$ superconducting or normal metal material 402.

As noted above, when the temperature is lowered, the superconducting region grows out from the highest $T_c$ superconducting material 402 outwards in the direction to the periphery as shown by the arrows, sweeping away the flux lines.

Figure 5A:
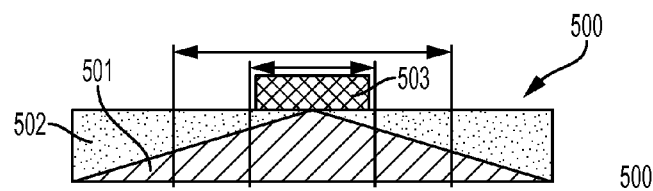
FIGS. 5(A)-(C) are schematic side views of a flux sweeping shield using the longitudinal proximity effect and the variable thickness proximity effect in various combinations, according to one embodiment consistent with the present invention.
Figure 5B:
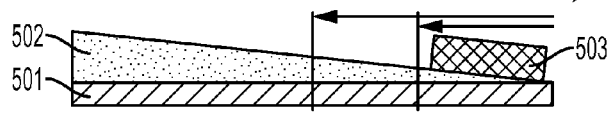
Figure 5C:
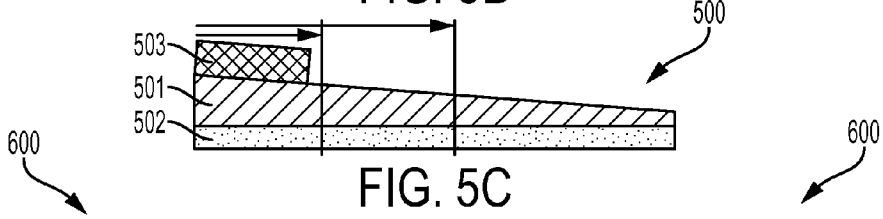

In other embodiments, a combination of (1) and (2) is shown in FIGS. 5(A)-(C), where in a shield 500 with a bilayer of lower $T_c$ superconducting or normal metal material 502 and a higher $T_c$ superconducting material 501, and an additional superconductor 503 with highest $T_c$, flux sweeping is carried out according to both the longitudinal proximity effect and the variable thickness proximity effect. As shown, the superconducting region grows out from the highest $T_c$ superconducting material 503 outwards in the direction shown by the arrows, sweeping away the flux lines.

(3) using an inverse or lateral inverse proximity effect (i.e., converse of the longitudinal proximity effect) in one embodiment, where a normal metal region reduces the superconducting order into a superconductor, causing a spatially growing order parameter in the lateral direction that increases from the normal metal to the superconducting region.

As one of ordinary skill in the art would appreciate, magnetic shields of the present invention can be accommodated in various other heterostructure configurations to the above disclosed two-dimensional planar structures, such as three-dimensional structures, which may also be non-planar. For example, shield structures may include closed surfaces, such as spheres, or a square (topologically equivalent), or a torus (with a hole in the center), or could include a compact surface made from a closed surface with a specific number of holes cut out of the surface, each with its own boundary (i.e., cylinder with both ends open (two boundaries/holes), or single open-ended cylinder (one boundary (one hole)— topologically equivalent to a hemispherical surface—i.e., a cup, a cone, frustum, or shell etc.).

Figure 6A:
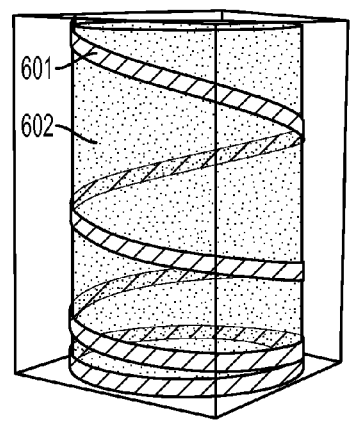
FIGS. 6(A)-(B) are side views of schematic representations of a three-dimensional flux sweeping shield of open-ended cylinder configurations, according to one embodiment consistent with the present invention.
Figure 6B:
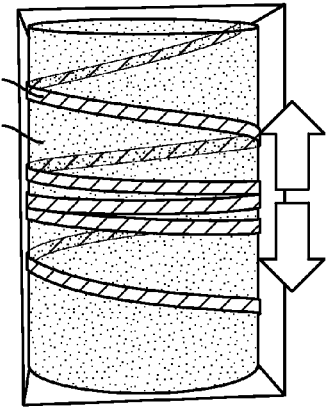
Figure 6C:
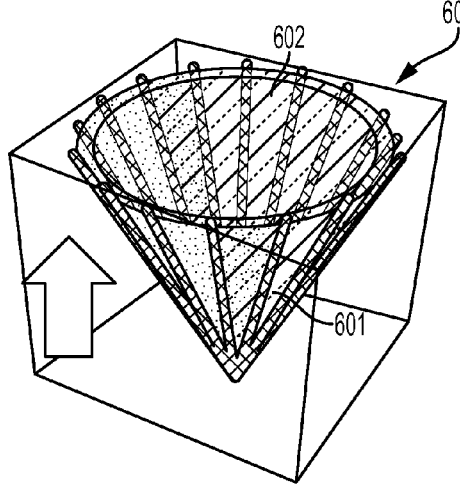
FIG. 6(C) is a perspective view of a schematic representation of a three-dimensional flux sweeping shield of a cone configuration, using the longitudinal proximity effect, according to one embodiment consistent with the present invention.

Exemplary representations are shown in FIGS. 6(A)-(C), which show open-ended cylinders 600 (FIGS. 6(A)-6(B)), and a three dimensional cone (FIG. 6(C)) with a high $T_c$ superconducting strip 601, with a width less than the critical length, disposed on a lower $T_c$ superconducting or normal metal material 602. As shown in the exemplary Figures, the flux sweeping is carried out in the direction shown by the arrow, according to the longitudinal proximity effect.

Figure 7:
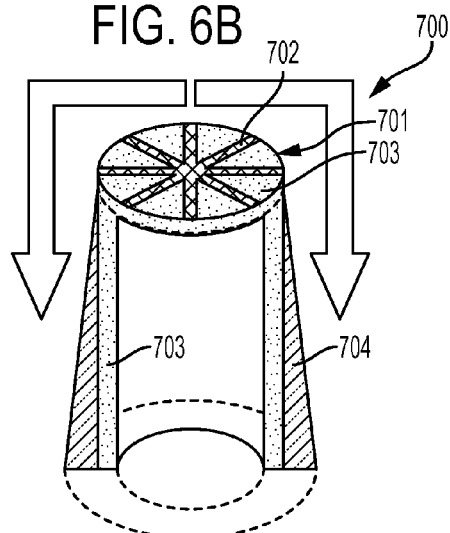
FIG. 7 is a schematic perspective view of a flux-sweeping cylindrical shield with a disc shield disposed at one open end, creating a shielded environment inside the cylinder, according to one embodiment consistent with the present invention.

In one exemplary embodiment as shown in FIG. 7, a cylindrical shield 700 with variable thickness has a disc shield 701 disposed at one open end. The disc shield 701 includes a higher $T_c$ superconducting layer 702, disposed on an intermediate $T_c$ weak pinning superconducting layer or superconducting/normal-metal bilayer 703. The walls of the cylinder, in one embodiment, include the intermediate $T_c$ weak pinning superconducting layer or superconducting/ normal-metal bilayer 703 as inner walls coated with an additional normal metal layer or lower $T_c$ superconductor 704. As shown in FIG. 7, the flux sweeping is carried out in the direction shown by the arrows, from disc center to disc perimeter and from the top of the cylinder to the bottom of the cylinder.

In one embodiment, the dimension of the magnetic shield flux sweeper of the present invention is determined by the initial field density of the ambient field that is to be reduced, and the critical field of the shielding material.

In one exemplary embodiment, the present invention is provided in a sensor, such as a Superconducting Transition-Edge Sensor (TES), which is a highly sensitive resistive thermometer used for precise thermal energy measurements, although one of ordinary skill in the art would know that the present invention could be used in any device requiring a magnetic shield.

In one exemplary embodiment, a disc magnetic shield 800 (i.e., superconducting TES), with a superconducting-metal/normal-metal (S/N) bilayer 801 of molybdenum/gold (Mb/Au) 804/805 (see FIGS. 8A-8G), in provided in a variety of different configurations. The shield 800 is designed to have an intrinsic transition temperature $T_{c1}$ without leads attached. However, since the Mb/Au bilayers 801 are connected at opposite ends to superconducting leads 803 with transition temperatures well above $T_{c1}$, superconductivity is inducted longitudinally into the Mb/Au bilayers 801 from the ends via the "longitudinal proximity effect".

In one embodiment, the shield 800 has an additional layer of gold (Au) bank structure 802 deposited on the bilayer 801, with the higher $T_c$ superconducting lead 803 (i.e., niobium which has a higher transition temperature around 9° K) deposited thereon in a desired pattern (see FIGS. 8A-8D for exemplary patterns) on the bilayer 801 and exposed Mb layer 804 (see FIGS. 8A-8E, and FIG. 8G). The superconductor 803 moves the order parameter up, and the Au bank structure 802 lowers the temperature even more. It is the normal metal (i.e., Au) which moves the order parameter down.

In one embodiment, the structure of the present invention allows the shield 800 to be tunable to 0.1-0.5° K. The superconductor material 803 (i.e., niobium) makes the resistivity drop to zero, by the Meissner effect. The cooling of the temperature moves the magnetic flux from the center to the edges and achieves the perfect Meissner state.

In one embodiment, FIGS. 8C-8D show an exemplary disc magnetic shield with an exemplary spiral pattern of the superconducting lead 803, with a thickness variation in the center which adds a higher $T_c$, and which pattern is used to sweep the magnetic flux away from the center of the shield 800 to the edges thereof. One of ordinary skill in the art would know that any pattern lead and thickness thereof may be used as long as the goal of the present invention is achieved. Determining the thickness of the layers 804, 805, 803 allows for the tuning of the superconductor 803 to the normal metal 805, which moves the superconductor 803 to a higher transition temperature $T_c$.

In one exemplary embodiment, there are trapping regions 806 disposed in the shield 800, where the magnetic flux appears as voids (see FIGS. 8D and 8F), and are shown between the gold (Au) bank structure 805 and the superconducting lead 803 (see FIG. 8G). The trapping regions 806 are really crystallographic defects which do not remove all the magnetic flux when cooled. These trapping regions 806 are not strictly necessary to be included in the shield 800, and if used, can be a variety of desired shapes.

In one embodiment, in an exemplary Corbino disc shield TES 800, an exemplary bilayer 800 may have the superconducting lead 803 disposed around the edges (possibly with an Au bank structure 802 around the outer edge), and separately in a central circular region. This exemplary configuration would have a diameter of the central superconducting layer 803 to be smaller than the size field's average vortex spacing that needs to be canceled for 1 µT, for a diameter 44 µm or smaller. For example, for a diameter 14 µm or smaller, 10 µT is used.

In one embodiment, using magnetic shield discs 800 of higher $T_c$ below every shield 800, the whole array of discs could be like one ground plane under the array that could be biased in series, and able to actively remove all trapped flux to a collector region at the perimeter. After running the current for a few seconds, all the vortex anti-vortex pairs would annihilate. Then pairs of the opposite polarity would be introduced to cancel the remainder out.

Figure 9A:
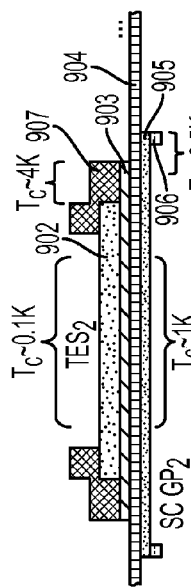
FIGS. 9(A)-9(B) is a schematic top view (FIG. 9A) and enlarged view (FIG. 9B) of a section of a sensor array, according to one embodiment consistent with the present invention.
Figure 9B:
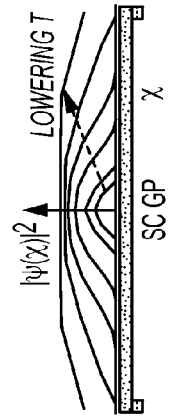
Figure 9C:
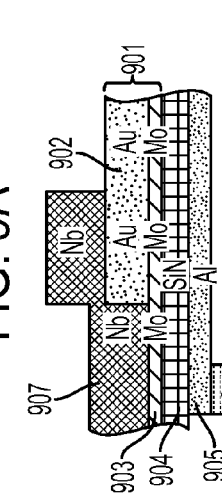
FIG. 9(C) shows an enlarged view of the end of the magnetic shield, according to one embodiment consistent with the present invention.
Figure 9D:
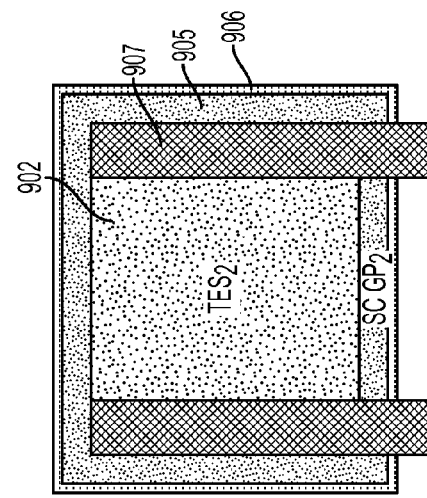
FIG. 9(D) shows flux lines of the magnetic shield, according to one embodiment consistent with the present invention.
Figure 9E:
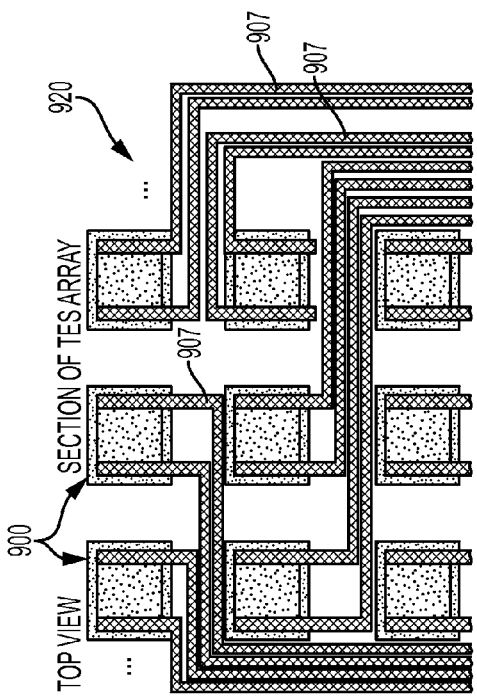
FIGS. 9(E)-9(F) show a magnetic shield array with a top view thereof, according to one embodiment consistent with the present invention.
Figure 9F:
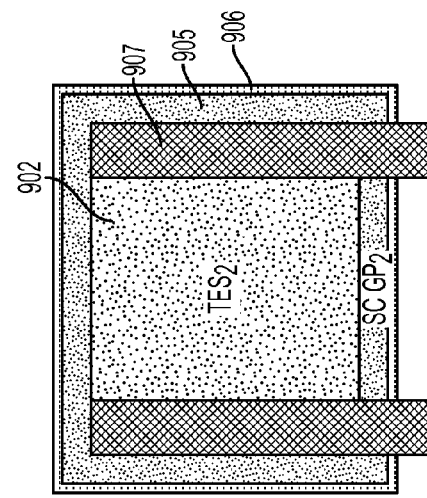

A side view of an exemplary embodiment of a magnetic shield 900 is shown in FIGS. 9A and 9B, with an enlarged view of one end of the shield 900 shown in FIG. 9C, and FIG. 9D showing the flux lines thereof. FIG. 9F is the top view of the shield 900 of FIG. 9B, and FIG. 9E is the top view of a section of a shield array 920 of the shield 900 of FIG. 9F.

In one exemplary embodiment, FIGS. 9A and 9C show a Superconducting magnetic shield (i.e., TES sensor) 900 with a Mo/Au (903/902) bilayer 901, disposed on a silicon nitride (SiN) insulator layer 904, superimposed on an Aluminum (Al) layer 905 which acts as a superconducting (SC) ground plane (GP) with order parameter shaping. In this exemplary embodiment, the normal metal structures include the Mo/Au bilayer 901 or Au layer 901, or the Al layer 905 with copper (Cu) superconductor 906 at the edges. In one embodiment, the Cu layer 906 has a transition temperature of 0.1° K. (see FIG. 9B), and is used as a magnetic shield. In this embodiment, the Cu superconductor 906 with the higher transition temperature $T_c$ fully shields the TES 900 at 0.1° K. In one embodiment, the Al layer 305 provides a Meissner state, where no magnetic field enters the device 900 unless it exceeds the aluminum (Al) $T_c$. A niobium (Nb) superconducting lead layer 307 is disposed at either end of the TES 900.

Thus, in this exemplary embodiment, the copper (Cu) layer 906 on the Al layer 905 lowers the temperature at the TES 900 edges due to the demagnetization factor, which provides a lower order parameter and moves the magnetic flux towards the edges of the TES 900 (see FIG. 9D). FIG. 9F shows the top view of FIG. 9B, and FIG. 9E shows an array 920 of TESs 900, with superconducting leads 907 connecting the TESs 900. The present invention is a 1000 times more sensitive than state-of-the-art magnetic shields, and expels the magnetic fields in the sensor (i.e., TES 900) towards the edges.

Figure 10A:
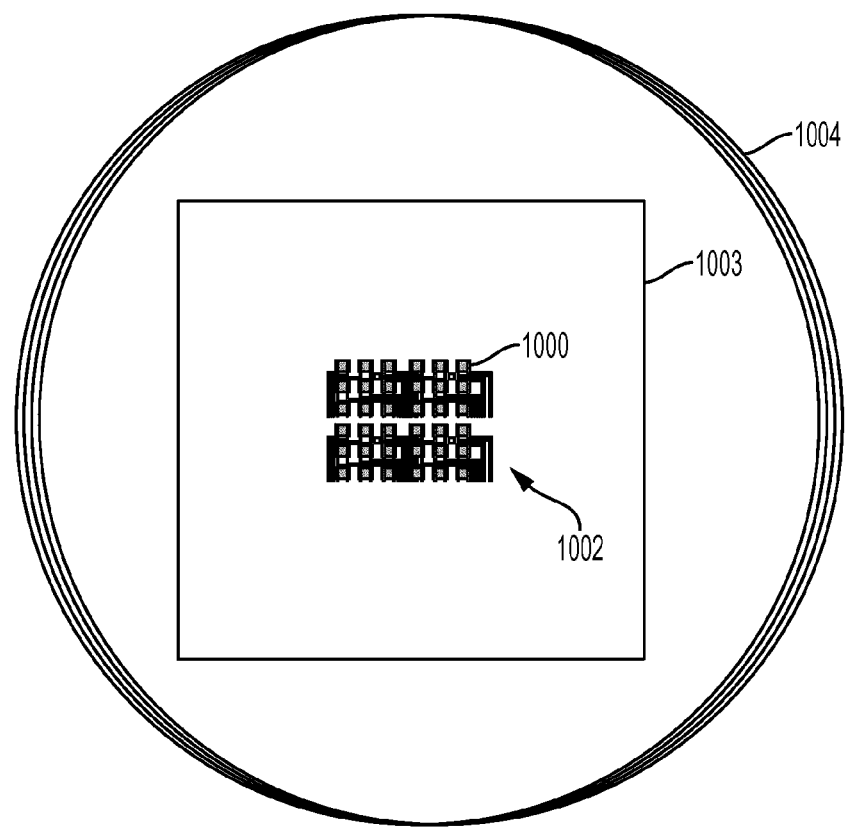
FIG. 10(A) shows superconducting shielding of an individual sensor or a whole sensor array, according to one embodiment consistent with the present invention.

In one embodiment, the present invention can be used to as superconducting shielding of individual sensors 1000, or a whole sensor array 1002, with a persistent current in a closed superconducting loop 1003 (see FIG. 10A). In this embodiment, the array 1002 (same as array 920 in FIG. 9E), can be surrounded by a compensating magnetic field coil 1004, providing a continuous superconducting loop 1003.

Figure 10B:
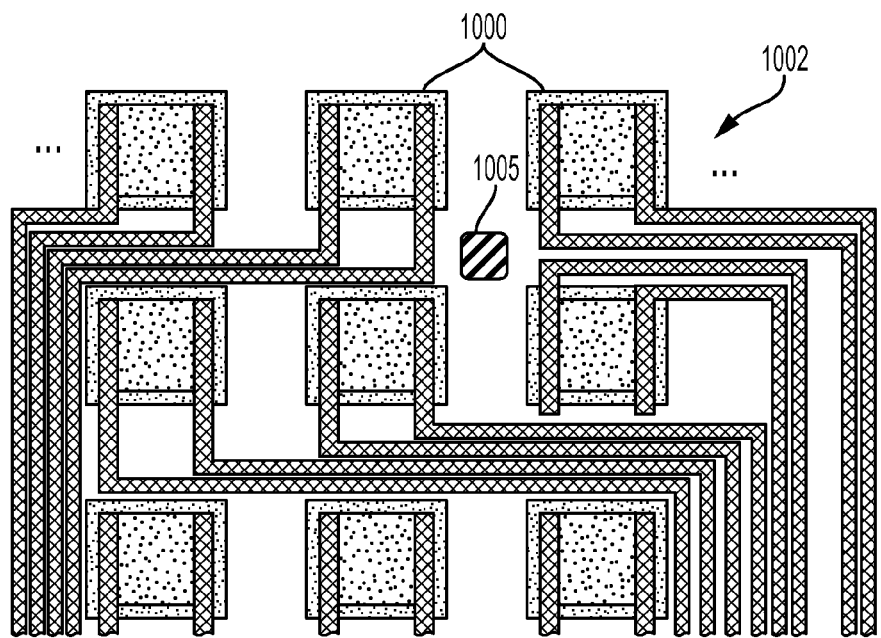
FIG. 10(B) shows a detector chip array, according to one embodiment consistent with the present invention.

Specifically, in this embodiment, above the $T_c$ of the superconducting loop 1003, the compensating magnetic field is applied such that the total magnetic field measures zero at the magnetometer 1005 (see FIG. 10B) in or near the array 1002. In the embodiment, while keeping the field nulled, the detector chip array 1002 is cooled well below the $T_c$ of the superconducting loop 1003 to the desired base temperature, and the applied magnetic field from the compensating coils 1004 is turned off. In one embodiment, instead of a loop 1003 around the whole array 1002, individual loops can be used around each individual pixel or sub-device in the array 1002. This continuous superconducting loop around each pixel can also be multi-purposed to carry current to the sensor(s) while also providing shielding to the sensor(s) from changes in the magnetic field.

The action of turning off the compensating coil magnetic field induces a persistent current in the superconducting loop 1003 oriented to oppose the applied magnetic field, thus reducing the field density of elements internal to the loop 1003. The loop current tends to cancel out the magnetic ambient magnetic field present in the system array 1002. Any further changes in the magnetic field will be opposed by a change in the current in the superconducting loop 1003.

In one embodiment, the superconducting loop 1003 or loops are fabricated lithographically on the same chip as the detector array 1002. Alternatively, the loop 1003 or loops can be placed above or below the detector plane in a similar configuration to reduce the field environment within its enclosing region.

Thus, in summary, the present invention is placed in proximity to magnetically sensitive regions that need protection. The present invention protects sensor and graphic circuits by clearing the magnetic flux from the device to the edges, and keeps the sensor in the perfect Meissner state. The magnetic shield of the present invention reduces the field component normal to the thin film device plane which is the dominant performance limiting field for many lithographic circuit applications. Thin film lithographic designs can be easily incorporated into standard thin film lithographic sensor processes, either on the same chip as the sensor or with another chip. Detectors are often 1000 times more sensitive to the vector component of the detector in this component of the field as compared to an in-plane component.

In one embodiment, the sensor region is placed above or below the magnetic shield to have the magnetic field reduced. The magnetic shield will also protect the sensor from changes in the magnetic field in the cryostat that occurs when it is cooled to the sensor's operating temperature.

Further, the present invention has a robust design that is relatively insensitive to thermal cycling or mechanical degradation during handling or during operation. Since there are no moving parts, no extra bias electrodes, no power consumption, and no extra steps or procedures in running the cryogenic detectors, the present invention's design is efficient and cost-effective. Further, heaters can be added to the configuration of the present invention, but are not specifically necessary. Thus, the present invention is a low mass, low heat capacity solution.

Advantages of the present invention include its low complexity, ease of use, reproducibility, longevity, scalability, and the fact that it does not require activation, monitoring or wiring. The magnetic shielding specifications are determined by the design of the shielding structure. The present invention reduces/eliminates magnetic "cross talk" or magnetic contamination between different parts of the sensing system.

The present invention also enables new sensing designs; for example, magnetic field generating components can be used with magnetic field sensitive components, and can be performed with larger magnetic field energies and in closer proximity than was previously possible.

In one embodiment, the magnetic shield of the present invention can itself be the electrical leads carrying current in a cryogenic detector. This is advantageous because many times flux is trapped in the superconducting leads of a sensor but is close enough to the sensor that it impacts the sensors operating state in very significant ways. By designing the leads themselves as a flux sweeper, then upon cooling, no flux will be trapped in the leads.

In another embodiment, the magnetic shield flux sweeper can itself be the sensor material or sensing element of the cryogenic detector; or the flux sweeper can be the electrical leads carrying current to a from the sensor.

In one embodiment, the sensing element is a temperature dependent resistor of a superconducting transition-edge sensor, or a temperature dependent magnetic response of a magnetic penetration depth thermometer (MPT). Further, in one embodiment, the sensing element is a superconducting quantum interference device (SQUID), rf-SQUID, SQUID array, superconducting parametric amplifier, superconducting nanowire detector, superconducting kinetic inductance detector (KID), superconducting mixer, or superconducting q-bit.

The present invention is also compatible with other magnetic shielding technologies. For example, high magnetic permeability describes a material with a maximum magnetic permeability on the order of 100,000 or more. These may include combinations of: (1) magnetic field sense and applied magnetic field compensation current carrying coils to cancel vector components of the magnetic field; (2) high magnetic permeability materials with optional degaussing coils to remove magnetic field lines from sensitive regions; (3) superconducting elements that use a diamagnetic response; and/or (4) superconducting loops and/or cylindrical structures that will automatically produce a current and magnetic field in opposition to changes in magnetic field consistent with Faraday's Law, Lenz's law, and the Aharonov-Bohm effect.

The present invention could be used with high mu-materials wrapped around a region; or, with high mu-materials with a degaussing coil, where it may be advantageous to complete the degaussing process at the coldest possible temperature that is above the critical temperature of the superconducting device being shielded, and then to proceed with cooling the superconducting device after the shield has been degaussed; or, any other configuration, including an Helmholtz configuration, of compensation coils and magnetic field sensors which can be designed to cancel out one, two, or three dimensions of magnetic field in a volume.

The present invention can be deployed throughout a sensing system and can be tailored for different applications requiring different specifications, and it can also be repeatedly deployed in an array format to protect arrays of magnetically sensitive devices, such as a superconducting quantum processor chip.

It should be emphasized that the above-described embodiments of the invention are merely possible examples of implementations set forth for a clear understanding of the principles of the invention. Variations and modifications may be made to the above-described embodiments of the invention without departing from the spirit and principles of the invention. All such modifications and variations are intended to be included herein within the scope of the invention and protected by the following claims.

What is claimed is:

1. A shield which protects magnetically sensitive devices, the shield comprising:
   a non-superconducting metal or lower transition temperature ($T_c$) material compared to a higher transition temperature material, disposed in a magnetic field environment;
   a temperature control system to cool the non-superconducting metal or lower transition temperature ($T_c$) material below its transition temperature to create a spatially varying order parameter's $|\Psi(r,T)|^2$ in said non-superconducting metal or said lower transition temperature material, where $\Psi$ is the superconductivity order parameter, r is a spatial position, and T is temperature;
   wherein said spatially varying order parameter is created by a proximity effect, such that said non-superconducting metal or said lower transition temperature material becomes superconductive as a temperature is lowered, creating a flux-free Meissner state, in order to sweep magnetic flux lines to a periphery of said non-superconducting metal or said lower transition temperature material.

2. The shield of claim 1, wherein said proximity effect is one of a variable thickness proximity effect, a longitudinal proximity effect, an inverse proximity effect, or combination thereof.

3. The shield of claim 2, the shield further comprising:
   a higher transition temperature ($T_c$) superconducting material disposed on said non-superconducting metal or said lower transition temperature ($T_c$) material.

4. The shield of claim 3, wherein said higher transition temperature superconducting material is disposed in a plurality of different patterns on said non-superconducting metal or said lower transition temperature ($T_c$) material.

5. The shield of claim 4, wherein the shield is provided in a plurality of heterostructure two-dimensional and three-dimensional structures, including planar and non-planar structures.

6. The shield of claim 5, wherein the shield comprises a planar disc or a cylinder.

7. The shield of claim 6, the shield further comprising:
a highest transition temperature ($T_c$) superconducting material;
wherein said non-superconducting metal or said lower transition temperature material and said higher transition temperature material form a bilayer; and
wherein said highest transition temperature superconducting material is disposed on said bilayer.

8. The shield of claim 7, wherein said proximity effect is a combination of said longitudinal proximity effect and said variable thickness proximity effect.

9. The shield of claim 6, wherein the shield is said cylinder; and
wherein said higher transition temperature material is provided in a strip with a width less than a critical length.

10. The shield of claim 6, wherein said cylinder is open-ended, and said planar disc is provided at one end of said open-ended cylinder.

11. The shield of claim 10, the shield further comprising:
an intermediate transition temperature superconducting material, said intermediate transition temperature superconducting material having a transition temperature between said higher transition temperature superconducting material and said non-superconducting metal; and
wherein said planar disc comprises said higher transition temperature superconducting material disposed in said plurality of different patterns on one of said intermediate transition temperature superconducting material, or a bilayer of said non-superconducting metal and a superconducting material.

12. The shield of claim 11, wherein sides of said open-ended cylinder are comprised of said intermediate transition temperature superconducting material, and said non-superconducting metal or said lower transition temperature ($T_c$) material in a variable thickness; and
wherein said magnetic flux lines are swept outwards from said center of said planar disc to a perimeter of said planar disc, and from a top of said open-ended cylinder where said planar disc is disposed, to a bottom of said open-ended cylinder.

13. The shield of claim 6, wherein said planar disc comprises said higher transition temperature superconducting material disposed in said plurality of different patterns on a bilayer of said non-superconducting metal and a superconducting material; and
wherein a superconducting lead is connected to one of said non-superconducting metal or said higher transition temperature superconducting material at each of two ends thereof.

14. The shield of claim 13, the shield further comprising:
a metal bank structure deposited on at least said non-superconducting metal;
wherein said metal bank structure comprises gold.

15. The shield of claim 14, wherein said non-superconducting metal is gold and said higher transition temperature superconducting material is molybdenum; and
wherein said superconducting lead comprises niobium.

16. The shield of claim 13, wherein said plurality of different patterns includes another superconducting lead disposed at a center of said planar disc at a greater thickness than at edges thereof, and allows for tuning of the shield; or
wherein said superconducting lead is disposed at edges of said metal bank structure and separately at said center of said planar disc.

17. The shield of claim 4, wherein trapping regions are disposed at edges of said at least one of said non-superconducting metal or said higher transition temperature superconducting material.

18. The shield of claim 13, the shield further comprising:
an insulator layer on which said higher transition temperature material is disposed; and
a metal layer ground plane on which said insulator layer is disposed; and
a superconductor disposed at edges of said metal layer ground plane.

19. An array of sensors comprising a plurality of shields of claim 1.

20. The array of claim 19, the array further comprising:
a magnetometer disposed in the array;
a continuous superconducting loop around the array; and
a compensating magnetic field coil disposed around the array.

21. A method of protecting a magnetically sensitive device, the method comprising:
creating a spatially varying order parameter's $|\Psi(r,T)|^2$ in a non-superconducting metal or a lower transition temperature ($T_c$) material compared to a higher transition temperature material, said non-superconducting metal or said lower transition temperature material being disposed in a magnetic field, where $\Psi$ is the superconductivity order parameter, r is a spatial position, and T is temperature;
wherein said spatially varying order parameter is created by a proximity effect, such that said non-superconducting metal or said lower transition temperature material becomes superconductive as a temperature is lowered, creating a flux-free Meissner state, in order to sweep magnetic flux lines to a periphery of said non-superconducting metal or said lower transition temperature material.

22. An electrical lead of a cryogenic detector, the lead comprising:
a magnetic flux sweeper which uses a proximity effect to create spatially varying order parameter's $|\Psi(r,T)|^2$ such that upon cooling, the electrical lead becomes superconductive and magnetic flux lines are swept to a periphery creating a flux-free Meissner state in said electrical lead which carries current to and from the cryogenic detector, where $\Psi$ is the superconductivity order parameter, r is a spatial position, and T is temperature.

23. A sensing element of a cryogenic detector comprising:
a magnetic flux sweeper which uses a proximity effect to create spatially varying order parameter's $|\Psi(r,T)|^2$ such that upon cooling, the sensing element becomes superconductive and magnetic flux lines are swept to a periphery creating a flux-free Meissner state in said sensing element of the cryogenic detector, where $\Psi$ is the superconductivity order parameter, r is a spatial position, and T is temperature.

24. The sensing element of claim 23, wherein said magnetic flux sweeper is a temperature dependent resistor of a superconducting transition-edge sensor.

25. The sensing element of claim 23, wherein said magnetic flux sweeper is a temperature dependent magnetic response of a magnetic penetration depth thermometer (MPT).

26. The sensing element of claim 23 wherein said magnetic flux sweeper is a superconducting quantum interference device (SQUID), rf-SQUID, SQUID array, superconducting parametric amplifier, superconducting nanowire detector, superconducting kinetic inductance detector (KID), superconducting mixer, or superconducting q-bit.

* * * * *